(12) United States Patent
Craninckx et al.

(10) Patent No.: US 8,120,440 B2
(45) Date of Patent: Feb. 21, 2012

(54) VOLTAGE CONTROLLED OSCILLATOR (VCO) WITH SIMULTANEOUS SWITCHING OF FREQUENCY BAND, OSCILLATION CORE AND VARACTOR SIZE

(75) Inventors: Jan Craninckx, Boutersem (BE); Dries Hauspie, Diksmuide (BE); Holger Kuhnert, Cambridge (GB)

(73) Assignee: IMEC, Leuven (BE)

( * ) Notice: Subject to any disclaimer, the term of this patent is extended or adjusted under 35 U.S.C. 154(b) by 238 days.

(21) Appl. No.: 11/995,658

(22) PCT Filed: Jun. 23, 2006

(86) PCT No.: PCT/EP2006/063526
§ 371 (c)(1),
(2), (4) Date: Sep. 16, 2008

(87) PCT Pub. No.: WO2007/006643
PCT Pub. Date: Jan. 18, 2007

(65) Prior Publication Data
US 2009/0015343 A1 Jan. 15, 2009

(30) Foreign Application Priority Data
Jul. 14, 2005 (EP) .................................... 05106490

(51) Int. Cl.
*H03B 1/00* (2006.01)
(52) U.S. Cl. .................. 331/177 V; 331/36 C; 331/167; 331/117 R; 331/117 FE; 331/16

(58) Field of Classification Search .............. 331/177 V, 331/16, 179, 117 R, 117 FE, 167
See application file for complete search history.

(56) References Cited

U.S. PATENT DOCUMENTS

| 7,133,485 B1 * | 11/2006 | Baird et al. .................. 375/376 |
| 2004/0166815 A1 | 8/2004 | Maligeorgos et al. |
| 2004/0196110 A1 | 10/2004 | Boccuzzi et al. |

FOREIGN PATENT DOCUMENTS

| EP | 0 942 531 A2 | 9/1999 |
| EP | 1 333 574 A2 | 8/2003 |

OTHER PUBLICATIONS

El-Gamal, M.N, et al., "Very Low-Voltage (0.8 V) CMOS receiver frontend for 5 GHz RF Applications," IEE Proc. Circuits Devices Syst., vol. 149, No. 5/6, 2002.

* cited by examiner

*Primary Examiner* — Arnold Kinkead
(74) *Attorney, Agent, or Firm* — McDonnell Boehnen Hulbert & Berghoff LLP

(57) ABSTRACT

The invention relates to a voltage controlled oscillator for generating a variable frequency. The oscillator comprises an oscillator core and a transconductive portion for compensating current losses in the oscillator core. The oscillator core comprises an inductive portion with at least one inductive element and a capacitive portion whose capacitance can be continuously varied by means of a control voltage for varying said frequency. The capacitive portion comprises multiple variable capacitive elements whose capacitance is continuously variable by means of said control voltage, each variable capacitive element being switchable for being added to or removed from the capacitive portion.

11 Claims, 4 Drawing Sheets

VOLTAGE CONTROLLED OSCILLATOR (VCO) WITH SIMULTANEOUS SWITCHING OF FREQUENCY BAND, OSCILLATION CORE AND VARACTOR SIZE

CROSS-REFERENCE TO RELATED APPLICATIONS

This application is a U.S. National Phase of International Application No. PCT/EP2006/063526, filed on Jun. 23, 2006, which claims priority to EP 05106490.5 filed on Jul. 14, 2005, both of which are incorporated herein by reference.

TECHNICAL FIELD

The present invention relates to a voltage controlled oscillator (VCO) for use in telecom transceiver ICs.

BACKGROUND ART

All RF transceiver ICs for mobile communication use an LC-VCO to generate the local oscillator (LO) signal, since this is the only topology that achieves the low phase noise required. Tuning the oscillation frequency is always done by changing the capacitance value, since it is almost impossible to change the inductance. The capacitance can be changed by using a varactor instead of a fixed capacitor, see FIG. 1.

Usually not a single large varactor is used, but instead a mixed discrete/continuous tuning scheme is used, see FIG. 2, in which
  a smaller varactor is used to continuously change the VCO frequency as a function of the control voltage;
  larger steps in frequency are realized by adding or removing digitally switched capacitors.
There are two advantages to this band-switched approach:
  the digitally switched capacitors often have a large Cmax/Cmin ratio, allowing a larger total VCO tuning range;
  the VCO gain will be lower, allowing a better design of the PLL in which this VCO will be embedded.
A VCO with a band-switched oscillator core is for example known from U.S. Pat. No. 6,836,193.

A problem that appears when very large tuning ranges are required, is that the operation of the oscillator core is not optimal for either the lower or the higher frequency bands.

DISCLOSURE OF THE INVENTION

It is an aim of this invention to provide a voltage controlled oscillator with possibly a very large tuning range, whose operation can be optimised for both the lower and the higher frequency bands.

According to the invention, the aforementioned aim is achieved with a voltage controlled oscillator comprising an oscillator core and a transconductive portion for compensating current losses in the oscillator core, the oscillator core comprising an inductive portion with at least one inductive element and a capacitive portion whose capacitance can be continuously varied by means of a control voltage for varying said frequency. The capacitive portion comprises multiple variable capacitive elements whose capacitance is continuously variable by means of said control voltage, each variable capacitive element being switchable for being added to or removed from the capacitive portion. In other words, the voltage controlled oscillator according to the invention comprises not a single large variable capacitive element, but a plurality of smaller variable capacitive elements.

The analysis of prior art VCOs has shown that their sensitivity, and hence the VCO gain, varies with the tuning voltage. This is caused by the fact that in order to change the frequency, the capacitance of the oscillator core is changed, but the size of the change in frequency depends on the relative importance of the capacitance change with respect to the total capacitance of the core. This effect can be avoided with the VCO according to the invention, in which the size of the variable capacitance element becomes as it were changeable, so that the relative importance of a capacitance change with respect to the total capacitance can be kept substantially constant. As a result, the variation on the VCO sensitivity to the tuning voltage over the whole frequency range can be minimised, thereby optimising the operation of the VCO over the whole frequency range.

Preferably, the VCO of the invention comprises at least three smaller variable capacitive elements of preferably substantially the same size for achieving the effect that the relative importance of a capacitance change with respect to the total capacitance can be kept substantially constant.

In a preferred embodiment of the VCO according to the invention, each variable capacitive element comprises a varactor with a voltage input and switching means for connecting the voltage input to the supply voltage, the control voltage or to ground. However, the switching of the variable capacitive elements may also be achieved in other ways.

In a preferred embodiment of the VCO according to the invention, the capacitive portion further comprises at least one switchable fixed capacitive element which can be added to or removed from the capacitive portion. In this way, a large VCO tuning range can be achieved.

The switchable capacitive elements preferably each comprise one or more capacitors and a first switch for adding/removing the capacitor(s) to/from the capacitive portion. The switchable capacitive elements can have the same or different capacitance values.

In a preferred embodiment of the VCO according to the invention, the transconductive portion comprises at least one switchable active element which can be added to or removed from the transconductive portion. In this way, the transconductance becomes adaptable to the frequency of the generated oscillation. This is an important advantage. An analysis of prior art oscillators has shown that their active cores, which provide the transconductance for overcoming the losses in the oscillator core, must always be designed for the toughest case, i.e. the minimum frequency of the range achievable by the oscillator. This implies that for higher frequencies, the active core is overdesigned, which leads to a waste of power and does not allow to reach a good phase noise performance. These disadvantages increase with the frequency range of the oscillator. With the oscillator of the invention, at least one and preferably more active elements can be switched off, i.e. removed from the transconductive portion, reducing the transconductance for the higher frequencies, making it possible to minimise the aforementioned disadvantages and optimise the performance of the oscillator over the whole frequency range.

The switchable active elements preferably each comprise a current source, such as for example a transistor, and a second switch for adding/removing the current source to/from the capacitive portion. The switchable active elements can have the same or different transconductance values.

In a preferred embodiment of the VCO of the invention, the switchable capacitive elements are part of the switchable active elements, so that one active element is switched each time a capacitive element is switched. This can simplify the control of the VCO of the invention.

MODES FOR CARRYING OUT THE INVENTION

Figure 1:
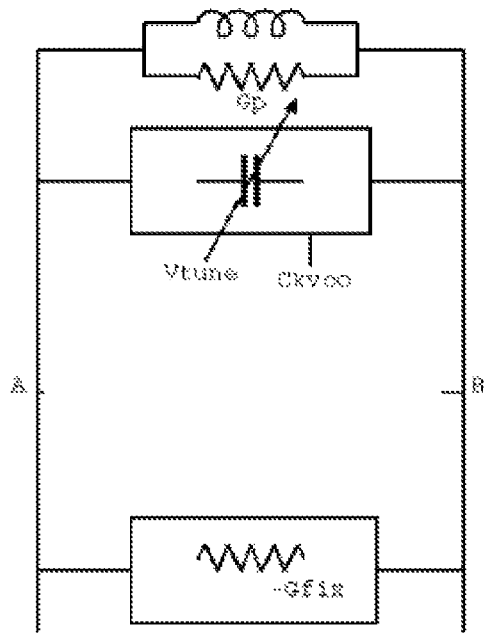
FIG. 1 shows a prior art LC-tuned VCO.
Figure 2:
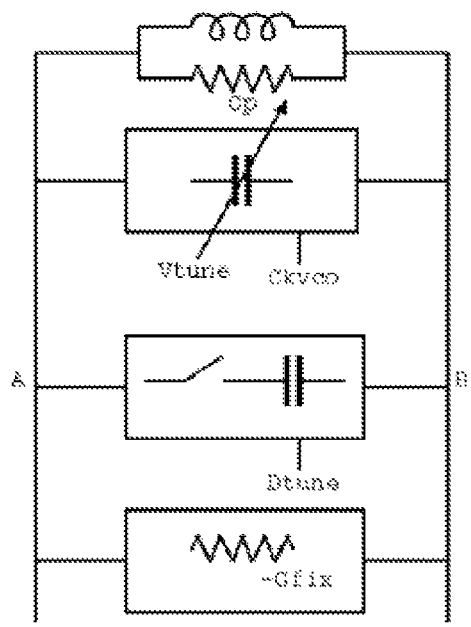
FIG. 2 shows a prior art LC-tuned VCO with band-switching.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

In the following, first a detailed analysis the problems of prior art VCOs is given, which lead to the fact that the operation of these VCOs are not optimized for their whole frequency range.

A first problem is the fact that the active cores, which provides the transconductance for overcoming the losses in the oscillator core, must always be designed for the toughest case, i.e. the minimum frequency of the range achievable by the oscillator.

Assume e.g. a VCO with a factor 2 tuning range (Fmax/Fmin=2). For a fixed inductor, this is accomplished with a varactor that has a factor 4 tuning range (Cmax/Cmin=4). Supposing most of the losses in the LC tank are caused by the inductor's series resistance Rs, the required negative resistance that has to be generated by the oscillator's active core is given by $Gm = Rs \cdot (\omega C)^2$ The ratio of the required transconductances in the minimum and maximum frequency case is thus also a factor 4! This means that if the VCO is designed for the toughest case, i.e. for the minimum frequency, it will be over-designed for the highest frequency by a factor 4, which is a waste of power and does not allow to reach good phase noise performance.

A possible solution could be to lower the conductance of the core in the high-frequency case. Assuming a MOS transistor in the quadratic region, this would however require a 16× current increase to achieve a 4× transconductance increase. Besides being totally impractical, this does not allow to design a good VCO since the transistor's operating point in both cases will have changed so much (e.g. from strong into weak inversion) that it will not be a good operating point for the transistor to achieve an optimal trade-off between e.g. power consumption and phase noise.

A second problem present in VCOs with large tuning ranges is the variation on the VCO sensitivity to the tuning voltage ($K_{VCO}$). If the varactor size is fixed, a change in the control voltage $\Delta V_{TUNE}$ will always result in a change in varactor voltage $\Delta C_{VAR}$. This should cause a change in frequency, but the size of this change depends on the relative importance of the capacitance change with respect to the total tank capacitance:

$$f = \frac{1}{2\pi\sqrt{L \cdot C}} \Rightarrow \frac{\Delta f}{\Delta C} = \frac{-1}{4\pi \cdot C \cdot \sqrt{L \cdot C}}$$

In the above example with a frequency ratio of 2, the tank capacitance must vary with a factor 4 between the highest and the lowest frequency. This implies that the frequency sensitivity to a capacitance change, and hence the VCO gain $K_{VCO}$, changes with a factor 4×sqrt(4)=8.

This large change in VCO gain over the whole tuning range will have serious consequences on the design of the Phase-Locked Loop (PLL), which will suffer from instability problems because of gain and bandwidth variations, and also from a non-perfect or even out-of-spec phase noise performance.

The first as well as the second problem affect the operation of the VCO in at least part of its frequency range, namely the higher frequency bands.

In the following, solutions are presented which make it possible to optimize the operation of the VCO over its whole frequency range.

For solving the first problem, it appears that not only the biasing current of the oscillator core needs to be changed, but simultaneously also the transconductance, which is provided by the active transistor, in order to keep the oscillator in its optimal biasing point.

Figure 3:
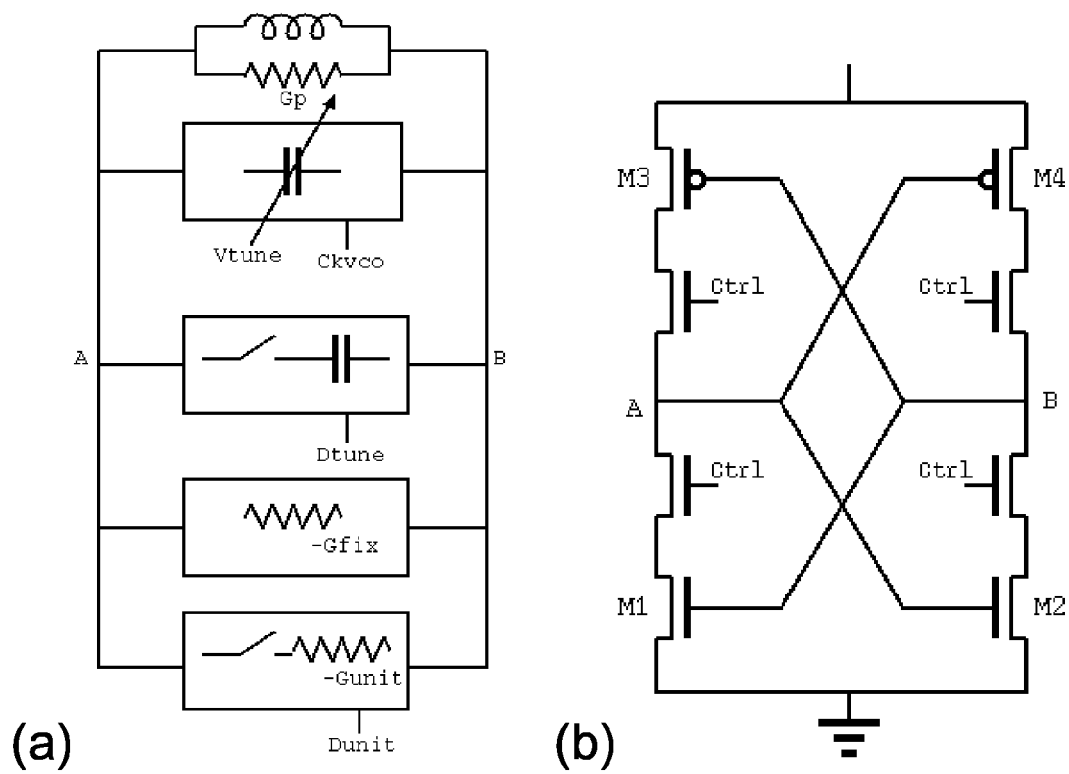
FIG. 3 shows (a) a VCO according to the invention with switchable active elements and (b) a possible scheme for a switchable active core.

This is a difficult thing to do, because to change e.g. the W of the transistor, this transistor has to be created as a multiple of several small unit transistors that can be switched on or off, see FIG. 3(a), which shows a VCO comprising the following components, parallel between the oscillator outputs A and B between which a variable frequency is generated:

an inductive portion with an inductive element and a parasitic resistance Gp;

a capacitive portion comprising a tunable capacitor, whose capacitance Ckvco is controllable by means of a control voltage Vtune, and a bank of switchable capacitors; and a transconductive portion comprising a fixed active element providing negative resistance −Gfix and a bank of switchable active elements providing negative resitance −Gunit.

The oscillator core or LC tank is formed by the inductive and capacitive portions, whereas the transconductive portion forms a switchable active core. The latter is preferably made such that the switches used to activate/deactivate it do not degrade the final performance. Several implementations are possible to disconnect an unused active core unit from the LC tank. An example for an oscillator using complementary transistors in its core is shown in FIG. 3(b). The size of the switches must be determined as a compromise between small series resistance to contribute only a small amount of extra phase noise, and small parasitic capacitance to allow the majority of the tank's capacitors to be made up of varactors.

Figure 4:
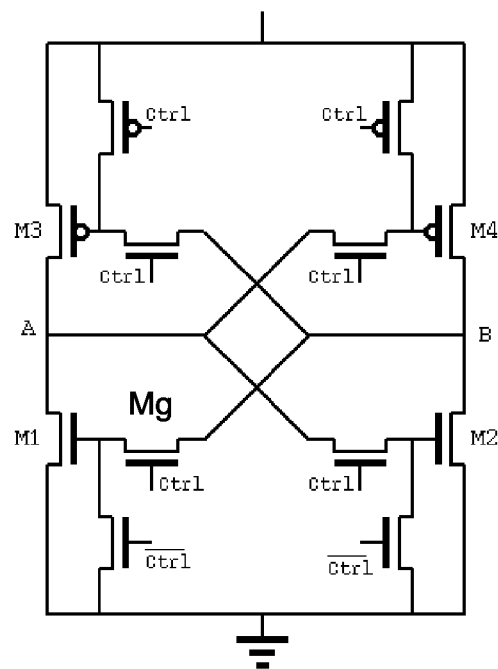
FIG. 4 shows a possible scheme for a switchable active core with simultaneous band-switching.

Since adding capacitance to the LC tank requires adding transconductances to the oscillator core, it is possible to combine the digitally switched capacitor with the switched unit transistor, see FIG. 4. This combination is apparent from the following comparison of two modes:

In the off-mode (Vg=0):

The active transistor (M1) does not take any current, so it is effectively out of the oscillator core The switch transistor in the gate (Mg) is also off, so the capacitance it presents to the oscillator's LC tank is given by its drain-bulk and gate-drain overlap only:

$C_{off} = C_{gdo,Mg} + C_{db,Mg}$

In the on-mode (Vg=1):

The active transistor (M1) is biased at the same gate-source voltage as the rest of the oscillator core, so its W is effectively contributing to the total W of the core.

The switch transistor (Mg) is on, meaning that it has a small drain-source resistance. The total capacitance presented to the oscillator tank is now given by the gate-drain and gate-source capacitance of Mg (which includes the gate-channel capacitance Cox), plus the gate capacitance of M1 (which is shielded by Mg's rds, but that effect should be minimized):

$C_{on} = C_{db,Mg} + C_{gdo,Mg} + C_{ox,Mg} + C_{sb,Mg} + C_{gso,Mg} + C_{gs,M1} + 2 \cdot C_{gdo,M1}$ So it appears that with this circuit simultaneously some capacitance is added to the oscillator core (the difference between Con and Coff) and a transistor is added to the active core.

Figure 5:
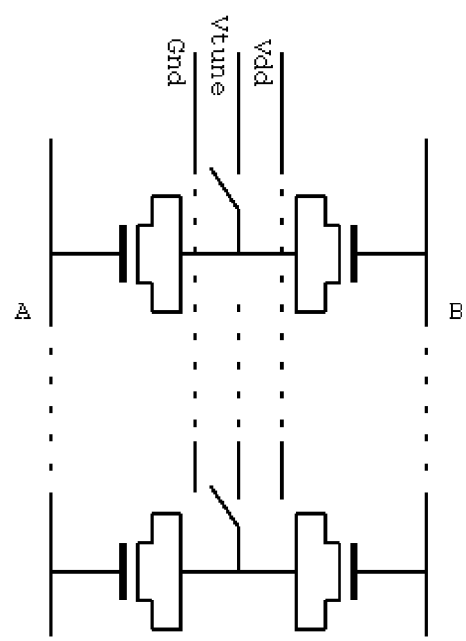
FIG. 5 shows an embodiment of a scalable analog varactor according to the invention.

For solving the second problem, the VCO gain should be substantially fixed or at least controlled in a proper way. This is solved by making the varactor size changeable, which can be done with the circuit shown in FIG. 5. Instead of making one large varactor, it is divided in a number of unit varactors that can be controlled in two modes:

on some unit varactors a digital control is used, to set the voltage to either Vdd or ground the other ones are controlled by the analog control voltage, and these are the only ones operating in real varactor mode to determine $K_{VCO}$.

Figure 6:
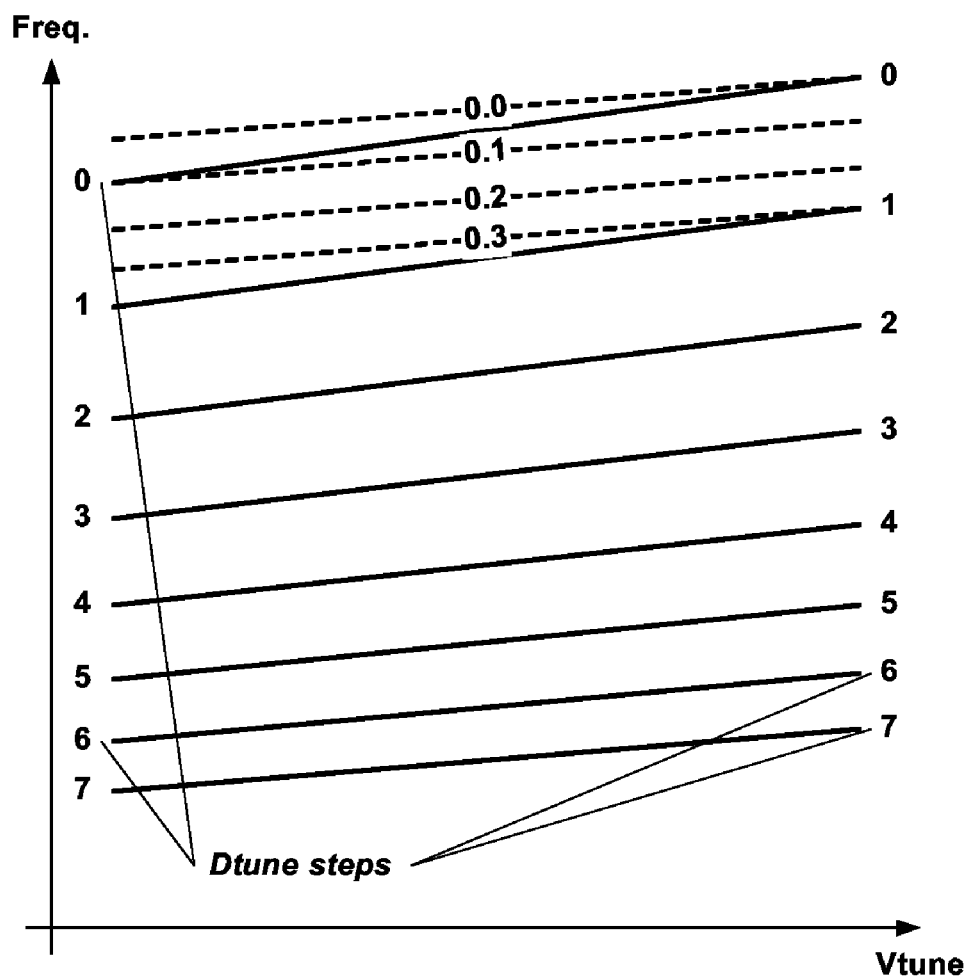
FIG. 6 shows a typical VCO tuning curve with a scalable analog varactor.

A typical tuning curve is depicted in FIG. 6. For low oscillation frequencies (the solid block line with Dtune=7), the total tank capacitance is large, and probably all unit varactors are used in analog mode to achieve a certain desired VCO gain.

When one single digital capacitance is removed (Dtune=6), the tuning curve shifts upwards, and the slope (which defines the VCO gain) increases.

For high oscillation frequencies (Dtune=0), the total tank capacitance is low and the step size between two digital frequency ranges is rather large. Now only a small amount of unit varactors is used in analog mode, and the other ones are controlled digitally.

This digital control will effectively create a number of sub-bands in the digital tuning curve, as indicated by the dotted-line tuning curves (0.0-0.3) in the case the number of digitally controlled unit varactor is 3. Curve 0.0 represents the tuning curve when all of these 3 unit varactors are switched off, curve 0.3 represents the curve with all of them on.

The fact that at these high oscillation frequencies less varactors are used in analog mode will also limit the VCO gain to the desired value. In contrast to the solid-line tuning curve 0, which has a high slope, the dotted-line tuning curves 0.0-0.3 have the same slope as the low-frequency tuning curve 7.

The invention claimed is:

1. A voltage controlled oscillator for generating a variable frequency, comprising an oscillator core and a transconductive portion for compensating current losses in the oscillator core, the oscillator core comprising an inductive portion with at least one inductive element and a capacitive portion whose capacitance can be continuously varied by means of a control voltage for varying said frequency, wherein the capacitive portion comprises multiple variable capacitive elements whose capacitance is continuously variable by means of said control voltage, each variable capacitive element being switchable for being added to or removed from the capacitive portion, and wherein each variable capacitive element comprises a varactor with a voltage input and switching means for selectively connecting the voltage input to any of a supply voltage, the control voltage, or to ground.

2. A voltage controlled oscillator according to claim 1, wherein the number of variable capacitive elements is at least three.

3. A voltage controlled oscillator according to claim 1 wherein said variable capacitive elements are of substantially the same size.

4. A voltage controlled oscillator according to claim 1, wherein the capacitive portion further comprises at least one switchable capacitive element which can be added to or removed from the capacitive portion.

5. A voltage controlled oscillator according to claim 4, wherein each switchable capacitive element comprises one or more capacitors and a first switch for adding/removing the capacitor(s) to/from the capacitive portion.

6. A voltage controlled oscillator according to claim 1, wherein the transconductive portion comprises at least one switchable active element which can be added to or removed from the transconductive portion.

7. A voltage controlled oscillator according to claim 6, wherein each switchable active element comprises a current source and a second switch for adding/removing the current source to/from the transconductive portion.

8. A voltage controlled oscillator according to claim 7, wherein the current source is a transistor.

9. A voltage controlled oscillator according to claim 6, wherein at least one of the switchable capacitive elements is part of one of the switchable active elements.

10. A voltage controlled oscillator according to claim 1, wherein said variable capacitive element is switchable to determine the variation on the sensitivity of the voltage controlled oscillator to the control voltage, and wherein said varactor operates in real varactor mode to determine said variation.

11. A voltage controlled oscillator according to claim 1, wherein said varactor is controllable either (i) in a digital mode when its input is connected to either the supply voltage or to ground, or (ii) in an analog mode when its voltage input is connected to the control voltage.

* * * * *